United States Patent
Inukai et al.

(10) Patent No.: US 11,651,953 B2
(45) Date of Patent: May 16, 2023

(54) METHOD FOR CLEANING SUBSTRATE AND CLEANING DEVICE

(71) Applicant: KIOXIA CORPORATION, Tokyo (JP)

(72) Inventors: Minako Inukai, Yokohama Kanagawa (JP); Hideaki Sakurai, Kawasaki Kanagawa (JP); Kyo Otsubo, Shinagawa Tokyo (JP); Tetsuo Takemoto, Yokohama Kanagawa (JP)

(73) Assignee: Kioxia Corporation, Tokyo (JP)

(*) Notice: Subject to any disclaimer, the term of this patent is extended or adjusted under 35 U.S.C. 154(b) by 365 days.

(21) Appl. No.: 16/904,058

(22) Filed: Jun. 17, 2020

(65) Prior Publication Data

US 2020/0321212 A1 Oct. 8, 2020

Related U.S. Application Data

(62) Division of application No. 15/448,549, filed on Mar. 2, 2017, now abandoned.

(30) Foreign Application Priority Data

Aug. 9, 2016 (JP) .................................. 2016-156815

(51) Int. Cl.
| | |
|---|---|
| *H01L 21/02* | (2006.01) |
| *B08B 3/04* | (2006.01) |
| *B08B 7/00* | (2006.01) |
| *B08B 3/08* | (2006.01) |
| *B08B 3/12* | (2006.01) |

(Continued)

(52) U.S. Cl.
CPC ........ *H01L 21/02101* (2013.01); *B08B 3/041* (2013.01); *B08B 3/08* (2013.01); *B08B 3/123* (2013.01); *B08B 7/0014* (2013.01); *H01L 21/67051* (2013.01); *H01L 21/67248* (2013.01); *H01L 22/12* (2013.01); *H01L 21/02082* (2013.01)

(58) Field of Classification Search
None
See application file for complete search history.

(56) References Cited

U.S. PATENT DOCUMENTS

| | | | |
|---|---|---|---|
| 8,029,622 | B2 | 10/2011 | Miya et al. |
| 9,214,331 | B2 | 12/2015 | Miya et al. |
| 2004/0206452 | A1 | 10/2004 | Okuda et al. |

(Continued)

FOREIGN PATENT DOCUMENTS

| | | |
|---|---|---|
| JP | S60143883 A | 7/1985 |
| JP | H0756323 | 3/1995 |

(Continued)

OTHER PUBLICATIONS

Japanese Office Action dated Jun. 21, 2019, mailed in counterpart Japanese Application No. 2016-156815, 8 pages (with translation).

*Primary Examiner* — Nicole Blan
(74) *Attorney, Agent, or Firm* — Kim & Stewart LLP

(57) ABSTRACT

According to one embodiment, a method including supplying a liquid onto a substrate, solidifying the liquid on the substrate to form a solidified body, and melting the solidified body of the liquid on the substrate is provided. When solidifying the liquid, an internal pressure of the liquid on the substrate is varied.

13 Claims, 11 Drawing Sheets

(51) Int. Cl.
    *H01L 21/67*     (2006.01)
    *H01L 21/66*     (2006.01)

(56) References Cited

U.S. PATENT DOCUMENTS

| | | |
|---|---|---|
| 2005/0284366 A1 | 12/2005 | Anderson et al. |
| 2009/0194234 A1 | 8/2009 | Arai et al. |
| 2010/0132742 A1 | 6/2010 | Tomita et al. |
| 2011/0041871 A1 | 2/2011 | Fan |
| 2012/0175819 A1 | 7/2012 | Miya et al. |
| 2013/0010289 A1 | 1/2013 | Nakamizo et al. |
| 2016/0059274 A1 | 3/2016 | Miya et al. |
| 2018/0047559 A1* | 2/2018 | Kamiya ............ H01L 21/67109 |

FOREIGN PATENT DOCUMENTS

| | | |
|---|---|---|
| JP | 4767138 | 9/2011 |
| JP | 2012064760 A | 3/2012 |
| JP | 2012169588 A | 9/2012 |
| JP | 2013138075 A | 7/2013 |
| JP | 5801678 | 10/2015 |

* cited by examiner

METHOD FOR CLEANING SUBSTRATE AND CLEANING DEVICE

CROSS-REFERENCE TO RELATED APPLICATIONS

This application is a division of U.S. Patent application Ser. No. 15/448,549, filed on Mar. 2, 2017, which is based upon and claims the benefit of priority from Japanese Patent Application No. 2016-156815, filed Aug. 9, 2016, the entire contents of each of which are incorporated herein by reference.

FIELD

Embodiments described herein relate generally to a method for cleaning a substrate and a substrate cleaning device.

BACKGROUND

Miniaturization of a semiconductor device is constantly progressing. Imprint lithography is a lithography technique for miniaturizing a semiconductor device. In imprint lithography, an imprint lithography template (hereinafter, referred to as a template) is used as a transfer a medium of an original pattern. The template is a substrate, for example, a glass substrate. The template is placed into contact with a resist layer formed on a semiconductor wafer or the like. The original pattern that is provided on a patterned surface of the template is transferred to the resist layer by the template. Since the template serves as the transfer medium, the patterned surface is required to be maintained at a high degree of cleanliness with very little foreign matter such as particles.

DETAILED DESCRIPTION

Figure 1:
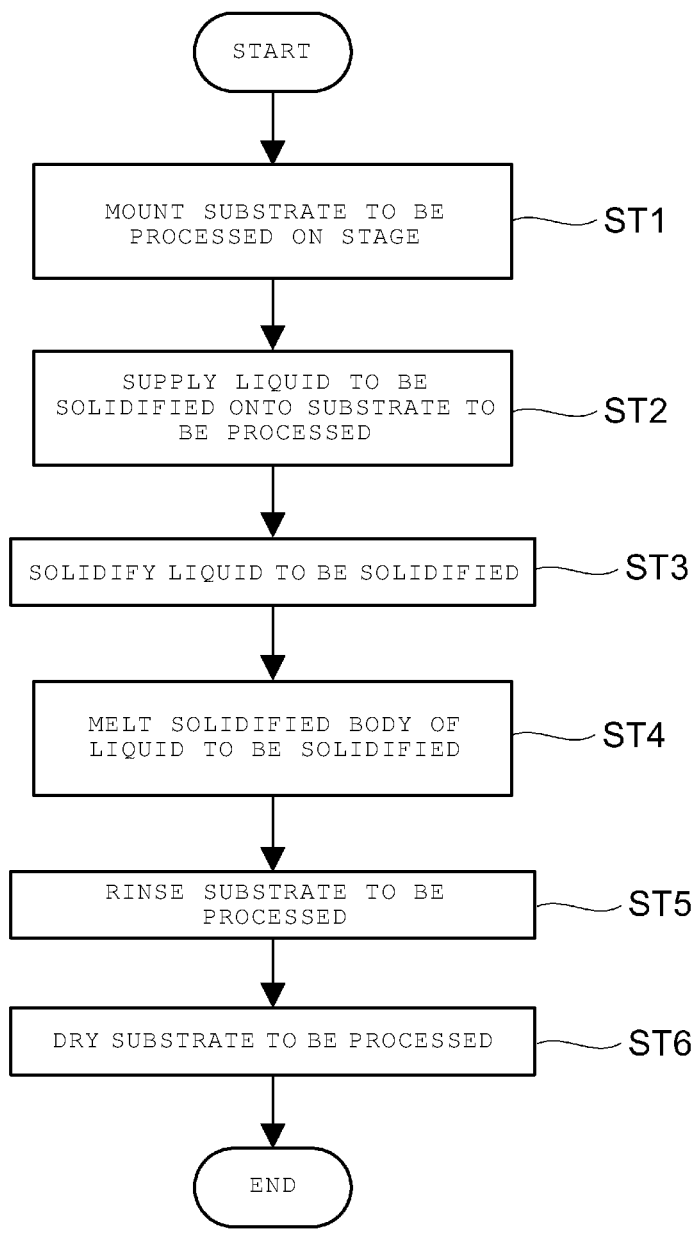
FIG. 1 is a flow chart illustrating an example of a method for cleaning a substrate according to a first embodiment.

Embodiments provide a method for cleaning a substrate and a cleaning device which are capable of obtaining a substrate with a high degree of cleanliness of a patterned surface thereof.

In general, according to one embodiment, a method for cleaning a substrate includes supplying a liquid onto a substrate, solidifying the liquid on the substrate to form a solidified body, and melting the solidified body of the liquid on the substrate is provided. When solidifying the liquid, an internal pressure of the liquid on the substrate is varied.

Hereinafter, embodiments will be described with reference to the drawings. In the drawings, the same elements are indicated by the same reference numerals. In the embodiments, cleaning of templates used in imprint lithography, for example, nanoimprint lithography will be used as an example.

First Embodiment

Cleaning Method

Figure 2:
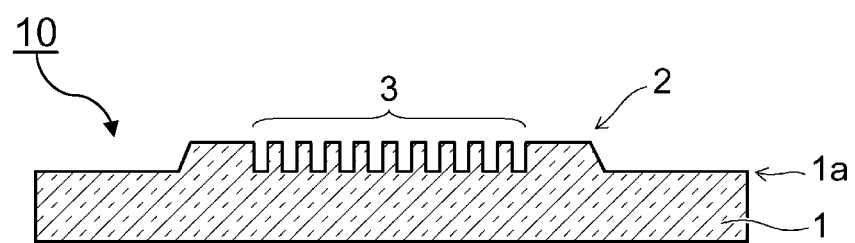
FIG. 2 is a schematic cross-sectional view illustrating an example of a template.

FIG. 1 is a flow chart illustrating an example of a method for cleaning a substrate according to a first embodiment. FIG. 2 is a schematic cross-sectional view illustrating an example of a template. FIGS. 3A to 3F are schematic cross-sectional views illustrating an example of the method for cleaning a substrate according to the first exemplary embodiment.

0. Preparation and Input of Substrate to be Processed

A substrate to be processed is carried into a processing chamber of the cleaning device. As illustrated in FIG. 2, an example of the substrate to be processed is, for example, a template 10 to be used for nanoimprint lithography.

The template 10 includes, for example, a quartz substrate 1. A convex shaped mesa 2 (consisting of protrusions and depressions) is provided on a patterned surface 1a of the quartz substrate 1. A patterned region 3 is provided in the mesa 2. The template 10 is an "original pattern" of a lithography process in a manufacturing process of a semiconductor device. In the lithography process, the patterned region 3 of the template 10 is pressed against, for example, a resist layer on a semiconductor wafer. Therefore, a pattern corresponding to the pattern provided on the patterned region 3 is transferred to the resist layer, for example. The pattern provided on the patterned region 3 corresponds to a wiring pattern or an open hole pattern of the semiconductor device. In the embodiment, for example, a line and space (L/S) pattern is formed as a pattern on the patterned region 3.

An example of the L/S pattern is a pattern with a half pitch of about 20 nm and a depth of about 40 nm. For example, about 20 small particles, having a size of about 15 nm or less, may be present on such a patterned surface 1a of the template 10. It is difficult to remove the small particles only by cleaning with an alkaline cleaning liquid and an acidic cleaning liquid. In the embodiment, the following cleaning methods are performed subsequent to cleaning using the alkaline cleaning liquid and the acidic cleaning liquid, for example.

1. Mounting of Substrate to be Processed on Stage

Figure 3A:
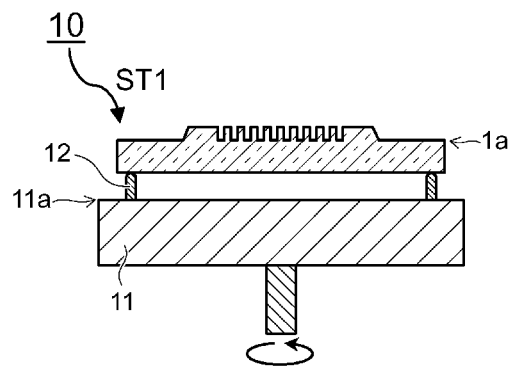
FIGS. 3A to 3F are schematic cross-sectional views illustrating an example of the method for cleaning a substrate according to the first embodiment.

As illustrated in Step ST1 in FIG. 1, and FIG. 3A, the template 10 is mounted on a stage 11 provided in a chamber (not illustrated) of the cleaning device. A plurality of lift pins 12 are provided on a mounting surface 11a of the stage 11. The lift pins 12 move in a vertical direction with respect to the mounting surface 11a. For example, the template 10 is supported on the mounting surface 11a by the lift pins 12.

2. Supplying of Liquid to be Solidified

Figure 3D:
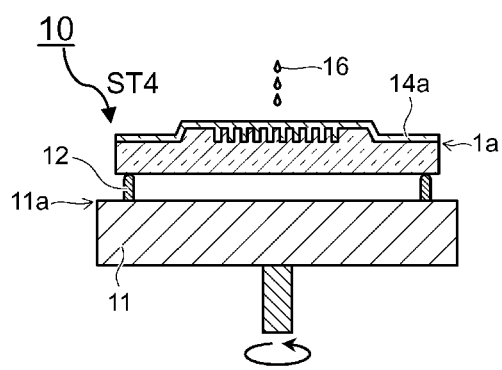
Figure 3B:
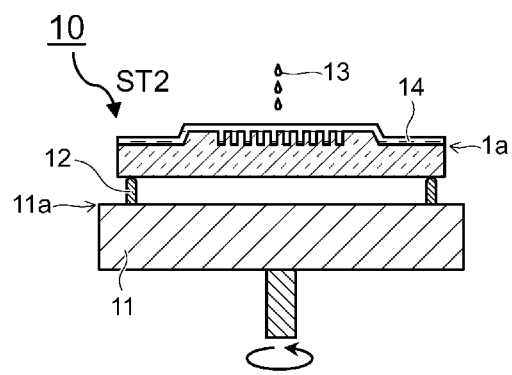

As illustrated in Step ST2 in FIG. 1, and FIG. 3B, a liquid (to be solidified) 13 is supplied onto the template 10 (substrate to be processed) 10 as the template 10 is rotated. Therefore, for example, a liquid film 14 is formed on the patterned surface la on the template 10. An example of the liquid 13 is deionized water (DIW). As the liquid 13, an alkaline liquid, an organic solvent, an aqueous solution containing a surfactant, or the like can be used in addition to the DIW.

Before Step ST2, the patterned surface la may be hydrophilized, for example. When hydrophilizing the patterned surface la, it becomes easier to form the liquid film 14 on the patterned surface la as compared with a case without hydrophilizing the patterned surface la. An example of a hydrophilization processing is a process of treating the patterned surface la with UV light.

Step ST2 may be performed in a state where the template (substrate to be processed) 10 is cooled. For example, the template 10 may be previously cooled. The liquid 13 is supplied onto the previously cooled template 10. By previously cooling the template 10 in this manner, it is possible to obtain an advantage where, for example, it is possible to shorten a time required for the next Step ST3.

3. Solidification of Liquid to be Solidified

Figure 3E:
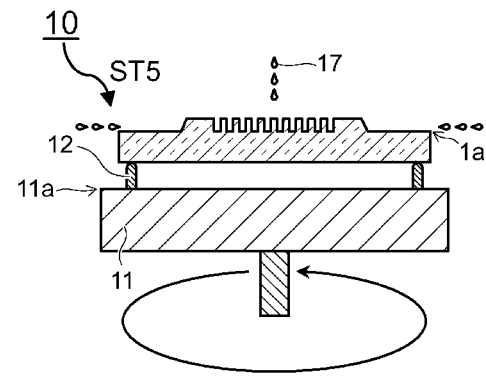
Figure 3C:
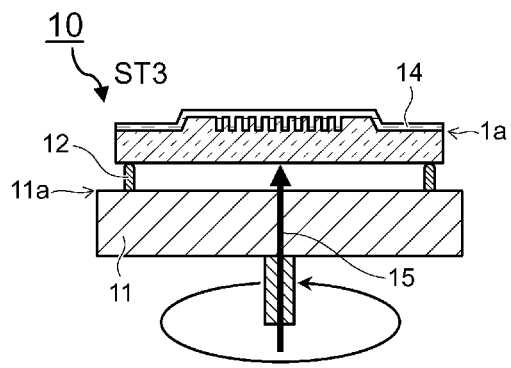

As illustrated in Step ST3 in FIG. 1, and FIG. 3C, a cooling gas 15 is discharged to the back surface of the template 10 to cool the liquid film 14, and the liquid 3 is solidified. An example of the cooling gas 15 is a nitrogen (N$_2$) gas. Cooling of the liquid film 14 may be a so-called "refrigerator system" of maintaining the inside the chamber at a low temperature in addition to discharging of the cooling gas 15.

Figure 4:
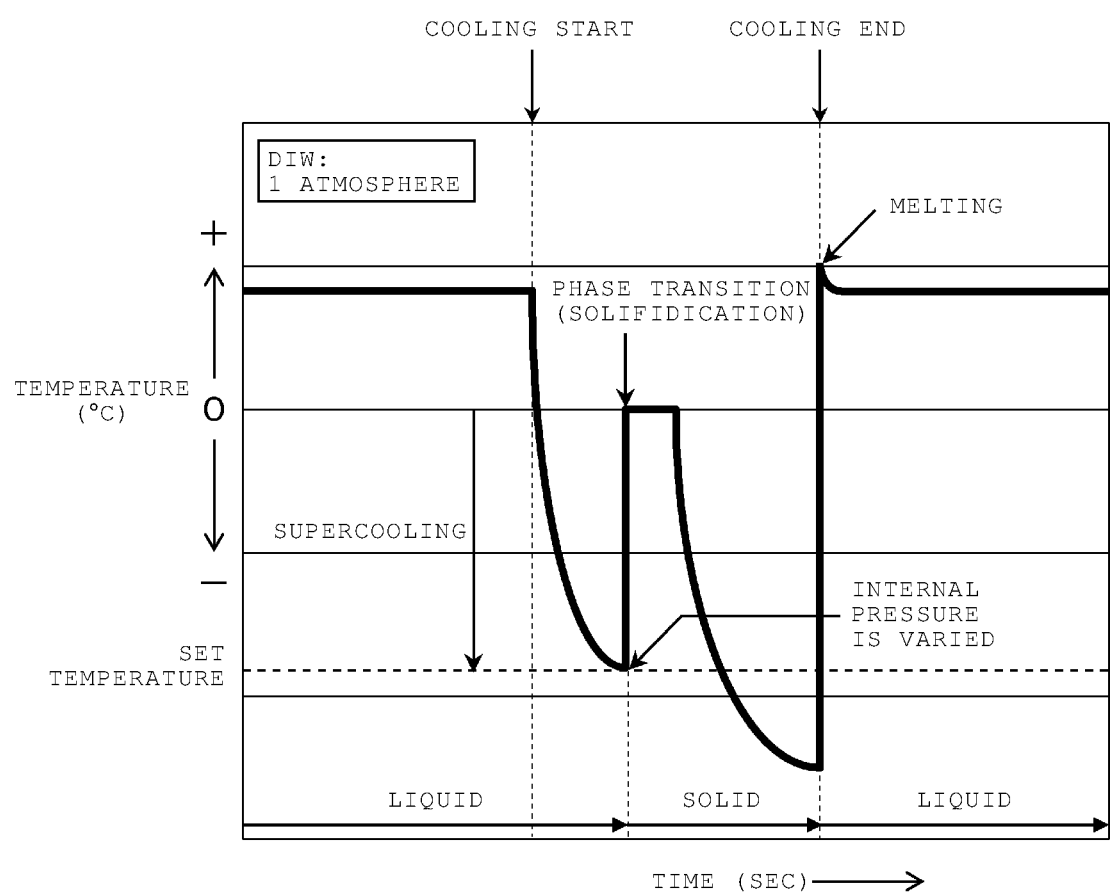
FIG. 4 is a diagram schematically illustrating a relationship between a time and a temperature of a liquid film.
Figure 5:
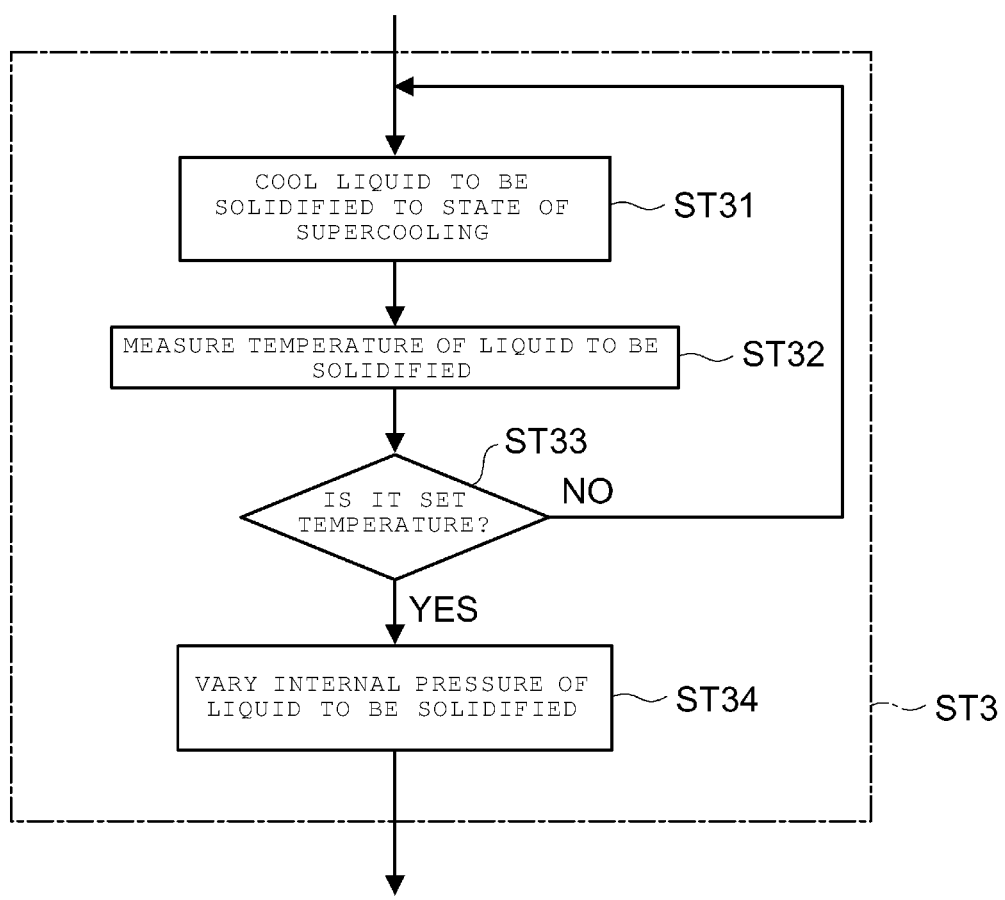
FIG. 5 is a flow chart illustrating an example of Step ST3.

FIG. 4 is a diagram schematically illustrating a relationship between the time and the temperature of the liquid film 14. FIG. 5 is a flow chart illustrating an example of Step ST3.

As illustrated in FIG. 4, the liquid to be solidified is, for example, the DIW. A freezing point of the DIW under "1 atmosphere" is "0° C.". Even if the temperature under the "1 atmosphere" is lower than 0° C., the DIW can be maintained in a liquid state, a so-called "supercooled state". In the embodiment, when the liquid to be solidified is solidified, the liquid film 14 is cooled to a temperature lower than the freezing point of the liquid to be solidified. Therefore, as illustrated in Step ST31 in FIG. 5, the liquid film (liquid 13 to be solidified) 14 is cooled in a state of supercooling.

As illustrated in FIG. 4, when cooling of the liquid film 14 is started, the temperature of the liquid film 14 drops. Finally, the temperature of the liquid film 14 becomes lower than "0° C. (freezing point)". The liquid film 14 is then in a state of supercooling.

In the embodiment, a "set temperature" is set to a temperature zone in which the liquid film 14 is supercooled. The "set temperature" is a temperature at which the supercooled liquid film 14 is solidified. An example of the range of the "set temperature" is equal to or higher than −40° C. and lower than 0° C. under a pressure of "1 atmosphere". In the embodiment, in order to obtain the temperature of the liquid film 14, for example, the temperature of the liquid film (liquid 13 to be solidified) 14 is measured as illustrated in Step ST32 in FIG. 5. The temperature of the liquid film 14 is measured using a non-contact infrared thermometer, for example. As the thermometer, a thermocouple, a resistance thermometer, or the like can be used in addition to the non-contact infrared thermometer.

Next, as illustrated in Step ST33, it is determined whether the temperature of the liquid film 14 reaches the set temperature. In a case where the temperature does not reach the set temperature (NO), the cooling is continued. In a case where the temperature reaches the set temperature (YES), as illustrated in Step ST34, an internal pressure of the liquid film (liquid to be solidified) 14 is varied.

When the internal pressure of the liquid film 14 is varied in a state where the liquid film 14 is supercooled, as illustrated in FIG. 4, a phase transition (solidification) occurs in the liquid film 14. A phase of the liquid film 14 is changed from the liquid to the solid. At this time, the temperature of the liquid film 14 returns to the freezing point. Thereafter, the temperature of the solidified liquid film 14 becomes lower than the freezing point again.

In this manner, in the present embodiment, the internal pressure of the liquid film 14 in a state of supercooling is varied and the liquid film 14 is solidified.

The internal pressure of the liquid film 14, for example, can be varied by the following feature.

Applying the stimulus to the liquid film 14 More specifically, the internal pressure of the liquid film 14 can be varied by the following features.

(1) Changing a rotational speed of the template 10
(2) Dropping a liquid onto the liquid film 14
(3) Applying an acoustic wave to the liquid film 14
(4) Vibrating the template 10
(5) Vibrating the liquid film 14
(6) Changing the pressure inside the chamber that stores the template 10

In a case of (1), the change of the rotational speed of the template 10 may be acceleration or deceleration. When accelerating, the rotational speed of the template 10 is set within a range in which the liquid film 14 on the template 10 is not lost by a centrifugal force.

In a case of (2), an example of the liquid is the DIW. Fine beads may be contained in the liquid. An example of the fine beads is a polystyrene latex (PSL) bead.

(3) In a case of (3), the acoustic wave may be an ultrasound wave.

(4) An example of (4) is a vertical movement of the lift pins 12. The lift pins 12 moves vertically in a state where the template 10 is supported by the lift pins 12. Therefore, the template 10 is vibrated. In addition to this, for example, the template 10 may be vibrated by causing a pole or vibrating member to make contact with the template 10.

An example of (5) is to cause a pole or vibrating member to contact the supercooled state liquid film 14. The nozzle which is provided in the cleaning device, for example, a DIW supplying nozzle or the like may be in contact with the liquid film 14.

In a case of (6), the change in pressure in the chamber may be pressure rising or pressure decreasing.

4. Melting of Solidified Body

As illustrated in Step ST4 in FIG. 1, and FIG. 3D, a melting liquid 16 is supplied to the solidified film 14a and the solidified body of the liquid to be solidified is melted in a state where the template 10 is rotated. An example of the melting liquid 16 is DIW. The melting liquid 16 may be any fluid. The fluid may be a gas. The fluid may be temperatureregulated. The fluid is not only supplied to the solidified film 14a but also may be in contact with the solidified film 14a. The solidified film 14a may also be naturally thawed without using the melting liquid 16.

5. Rinsing of Substrate to be Processed

As illustrated in Step ST5 in FIG. 1, and FIG. 3E, a rinsing liquid 17 is supplied to the template 10 and the template (substrate to be processed) 10 is rinsed in a state where the template 10 is rotated. An example of the rinsing liquid 17 is DIW. The rinsing liquid 17 and the melted liquid film 14 are removed from the patterned surface la of the template 10 by increasing the rotational speed of the template 10, for example.

6. Drying of Substrate to be Processed

Figure 3F:
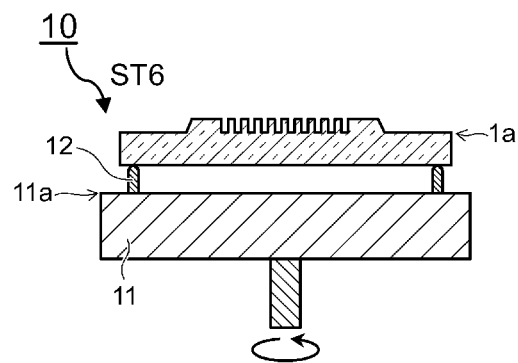

As illustrated in Step ST6 in FIG. 1, and FIG. 3F, for example, the template (substrate to be processed) 10 is dried in a state where the template 10 is rotated. After drying is ended, the template 10 is transported from inside the processing chamber of the cleaning device. Therefore, an example of the method for cleaning a substrate according to the first embodiment is provided.

Comparison with Reference Example

Figure 6:
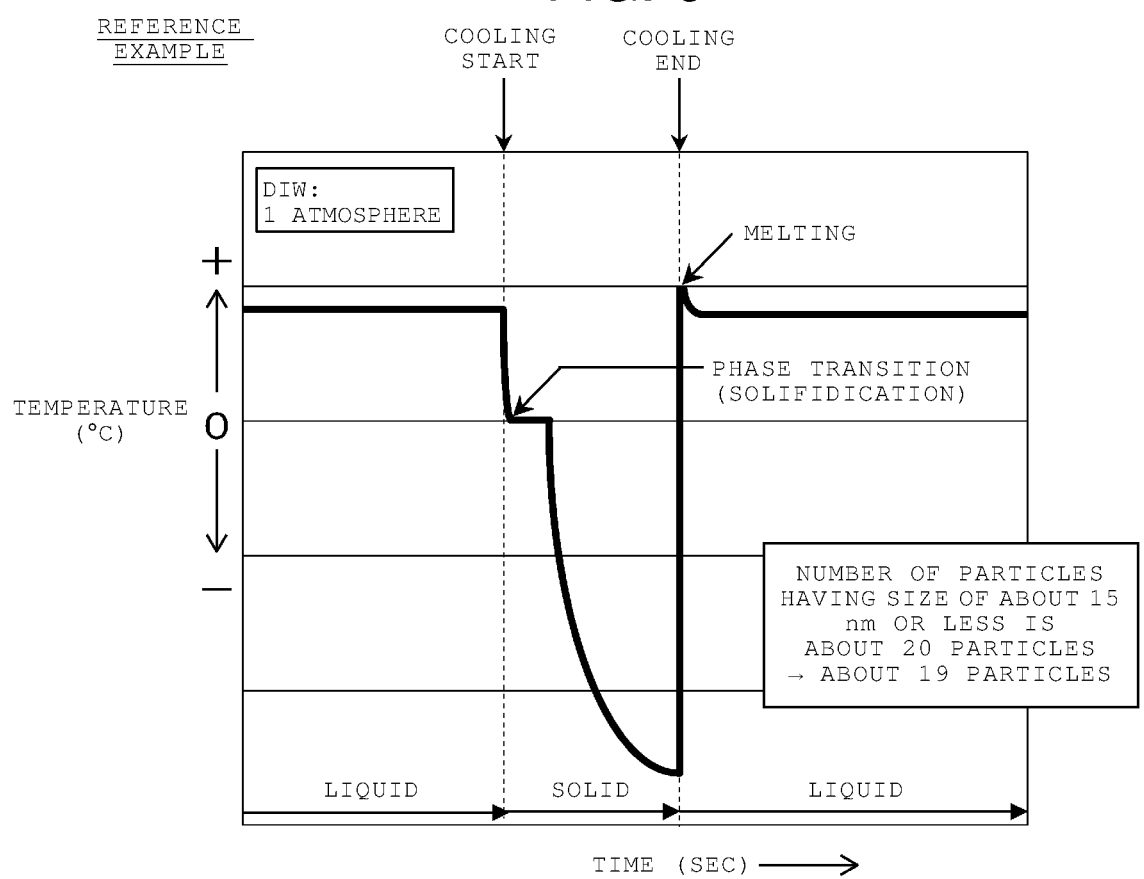
FIG. 6 is a diagram schematically illustrating a relationship between the time and the temperature of a liquid film in a reference example.
Figure 7:
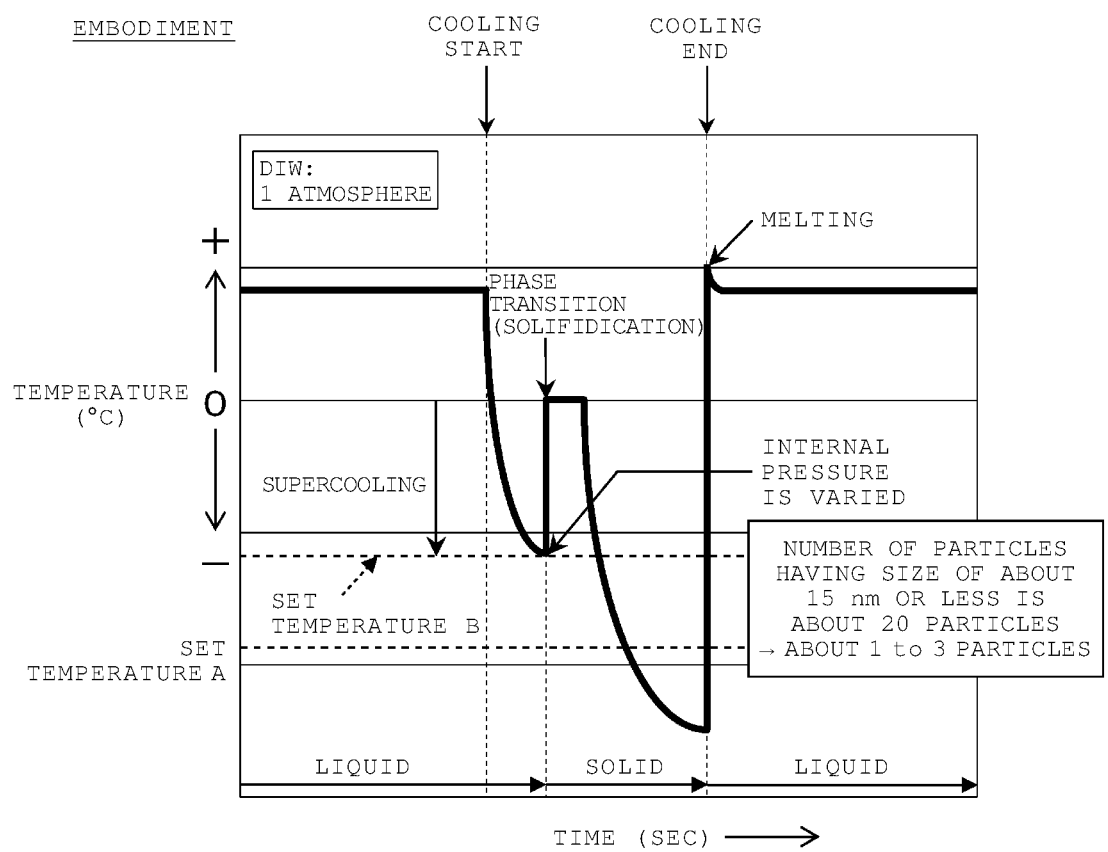
FIG. 7 is a diagram schematically illustrating a relationship between the time and the temperature of a liquid film in an embodiment.

FIG. 6 is a diagram schematically illustrating a relationship between the time and the temperature of a liquid film 14 in a reference example. FIG. 7 is a diagram schematically illustrating a relationship between the time and the temperature of a liquid film 14 in an embodiment.

Reference Example

The reference example is a case where the liquid film 14 is solidified without being in a supercooled state.

In the reference example illustrated in FIG. 6, the liquid film 14 solidifies when the temperature reaches the freezing point (0° C.). In the reference example, the number particles having a size of about 15 nm or less (hereinafter, referred to as small particles) is about 20 particles before cleaning. After cleaning, the number of the small particles is decreased to about 19 particles. The removal efficiency of the reference example is about 5%.

Embodiments

In the embodiment illustrated in FIG. 7, when the temperature of the liquid film 14 reaches a set temperature B lower than the freezing point, the internal pressure of the liquid film 14 is varied. After the internal pressure is varied, the liquid film 14 is solidified. In the embodiment, the number of the small particles is about 20 particles before cleaning. After cleaning, the number of the small particles is decreased to about 1 to 3 particles. A set temperature "A" illustrated in FIG. 7 is the set temperature illustrated in FIG. 4. The set temperature "A" is lower than the set temperature "B".

At the set temperature "A", the number of the small particles is decreased from about 20 particles to about 3 particles. The removal efficiency is about 85%.

At the set temperature "B", the number of the small particles is decreased from about 20 particles to about 1 particle. The removal efficiency is about 95%.

There is a difference between the removal efficiency of the set temperature "A" and the removal efficiency of the set temperature "B". However, since the number of the small particles is small, the difference is within a tolerance. Although the removal efficiency of the reference example is less than 10%, the removal efficiencies of the embodiment of both the set temperature "A" and the set temperature "B" exceed 80%.

According to the method for cleaning a substrate according to the first embodiment, it is possible to provide the method for cleaning a substrate that is capable of obtaining a substrate with a high degree of cleanliness of the patterned surface.

Second Embodiment

A second embodiment is an example of a cleaning device that is capable of executing the method for cleaning a substrate according to the first embodiment. Hereinafter, a first example to a sixth example of the cleaning device will be described.

Cleaning Device: First Example

Figure 8:
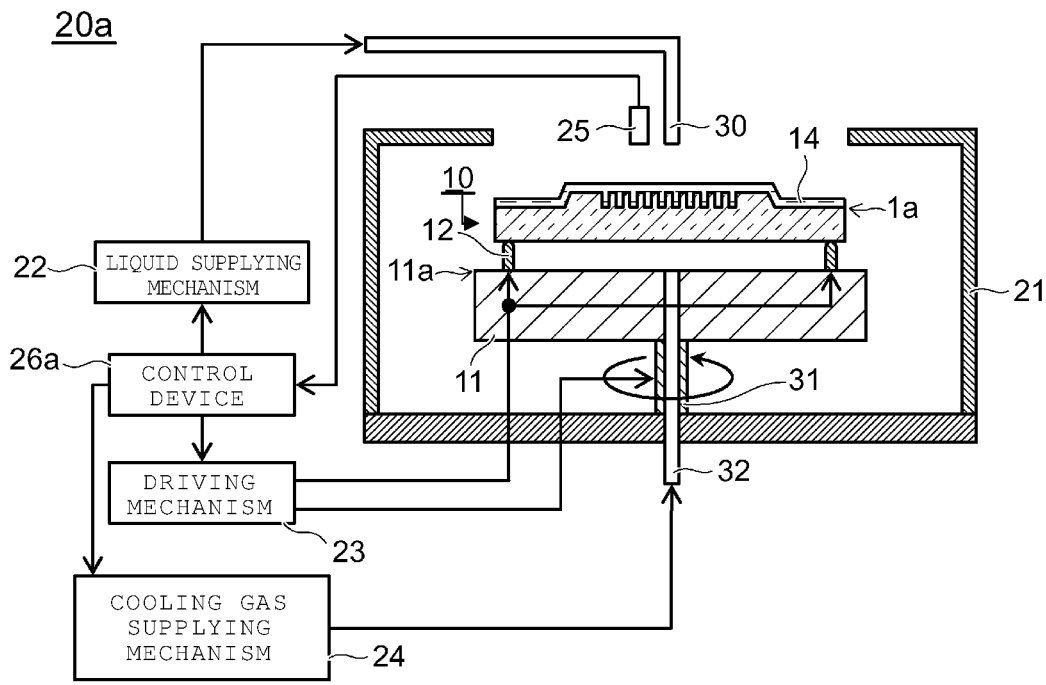
FIG. 8 is a schematic cross-sectional view schematically illustrating a cleaning device of a substrate according to a first example.

FIG. 8 is a schematic cross-sectional view schematically illustrating a cleaning device of a substrate according to a first example.

The cleaning device 20a according to a first example is an example in which the internal pressure of the liquid film 14 can be varied by the following feature.

(1) Changing the Rotational Speed of the Template 10

As illustrated in FIG. 8, the cleaning device 20a according to the first example includes a cleaning cup 21, a liquid supplying mechanism 22, a driving mechanism 23, a cooling gas supplying mechanism 24, a thermometer 25, and a control device 26a.

A shape of the cleaning cup 21 is, for example, cylindrical. The stage 11 is accommodated in the cylindrical cleaning cup 21.

A liquid supplying nozzle 30 is arranged above the template 10. The liquid supplying nozzle 30 is connected to the liquid supplying mechanism 22. The liquid supplying mechanism 22 supplies the liquid to be solidified onto the patterned surface la of the template 10 through the liquid supplying nozzle 30.

The lift pins 12 are provided inside the stage 11. The stage 11 is supported by a shaft 31. The lift pins 12 and the shaft 31 are connected to the driving mechanism 23. The driving mechanism 23 includes a lift pin driving portion that drives the lift pins 12 and a shaft driving portion that drives the shaft 31. In FIG. 8, details of the lift pin driving portion and the details of the shaft driving portion will be omitted. The lift pin driving portion and the shaft driving portion may have a well-known structure, for example.

The lift pin driving portion moves the lift pins 12 vertically in a vertical direction with respect to the mounting surface 11a. Therefore, the template 10 is moved vertically with respect to the mounting surface 11a. The shaft driving portion rotates the shaft 31. Therefore, the template 10 is rotated in a horizontal direction with respect to the mounting surface 11a.

A cooling gas supplying pipe 32 is provided in the shaft 31, for example. The cooling gas supplying pipe 32 is connected to the cooling gas supplying mechanism 24. The cooling gas supplying mechanism 24 supplies the cooling gas, for example, to the rear surface of the template 10 through the cooling gas supplying pipe 32.

The thermometer 25 is arranged above the template 10. The thermometer 25 measures the temperature of the liquid film 14 formed on the template 10. An example of the thermometer 25 is a non-contact infrared thermometer. As the thermometer 25, a thermocouple, a resistance thermometer, or the like may be used in addition to the non-contact infrared thermometer.

The control device 26a controls the liquid supplying mechanism 22, the driving mechanism 23, and the cooling gas supplying mechanism 24. The control device 26a executes the cleaning method described in the first embodiment based on the temperature of the liquid film 14 measured by the thermometer 25.

If the temperature of the liquid film 14 reaches the "set temperature" illustrated in FIG. 4, for example, the control device 26a controls the driving mechanism 23 to change the rotational speed of the template 10. Therefore, the liquid film 14 in a state of supercooling is solidified. The change of the rotation speed may be acceleration or deceleration.

The method for cleaning a substrate according to the first embodiment can be executed by the cleaning device 20a according to the first example as illustrated in FIG. 8, for example.

Cleaning Device: Second Example

Figure 9:
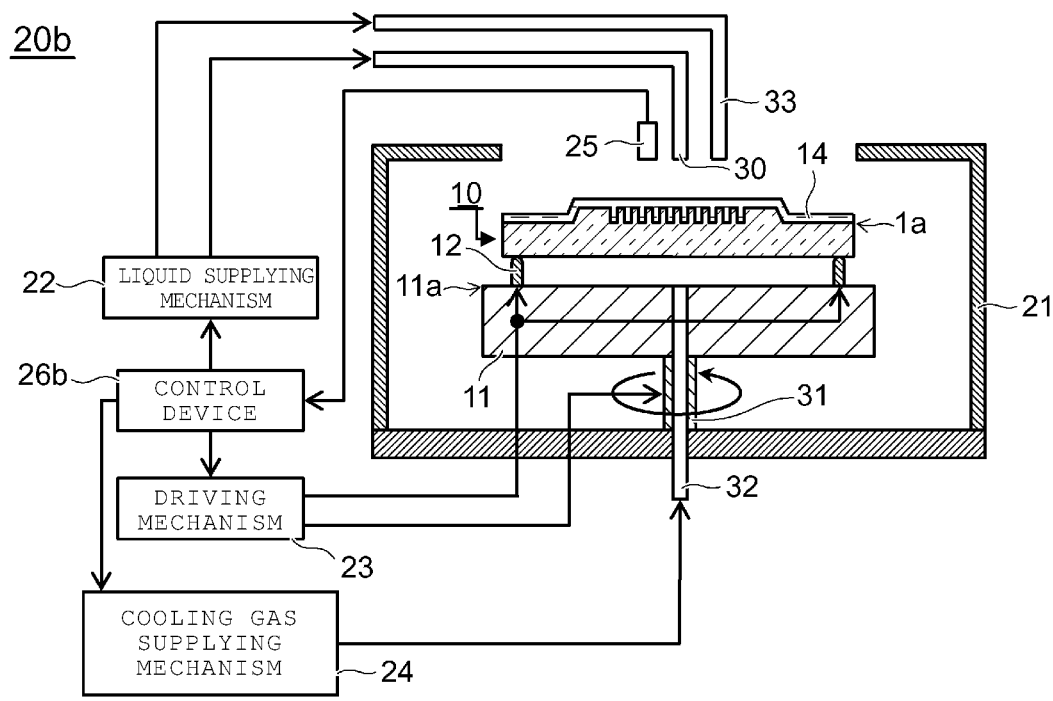
FIG. 9 is a schematic cross-sectional view schematically illustrating the cleaning device of the substrate according to a second example.

FIG. 9 is a schematic cross-sectional view schematically illustrating the cleaning device of the substrate according to a second example. The cross-section illustrated in FIG. 9 corresponds to the cross-section illustrated in FIG. 8.

The cleaning device 20b according to a second example is an example in which the internal pressure of the liquid film 14 can be varied by the following feature.

(2) Dropping a Liquid onto the Liquid Film 14

As illustrated in FIG. 9, a difference between the cleaning device 20b according to the second example and the first example illustrated in FIG. 8 is that the second example further includes a second liquid supplying nozzle 33.

Similarly to the liquid supplying nozzle 30, the second liquid supplying nozzle 33 is arranged above the template 10. The liquid supplying nozzle 30 is connected to the liquid supplying mechanism 22. The liquid supplying mechanism 22 of the second example further includes a portion where a liquid for applying a stimulus to the liquid film 14 (hereinafter, referred to as a dropping liquid) is supplied in addition to the portion where the liquid to be solidified is supplied. The liquid supplying mechanism 22 of the second example supplies the dropping liquid onto the patterned surface 1a of the template 10 through the second liquid supplying nozzle 33.

When the temperature of the liquid film 14 reaches the "set temperature", a control device 26b controls the liquid supplying mechanism 22 to drop the dropping liquid onto the liquid film 14. Therefore, the liquid film 14 in a state of supercooling is solidified. Fine beads, for example, PSL beads may be contained in the dripping liquid.

As the dripping liquid, the same liquid as the liquid to be solidified can be used. In this case, the second liquid supplying nozzle 33 can be omitted. When the temperature of the liquid film 14 reaches the "set temperature", the control device 26b may drop the liquid to be solidified onto the liquid film 14 again by controlling the liquid supplying mechanism 22.

The method for cleaning a substrate according to the first embodiment can be executed by the cleaning device 20b according to the second example as illustrated in FIG. 9, for example.

Cleaning Device: Third Example

Figure 10:
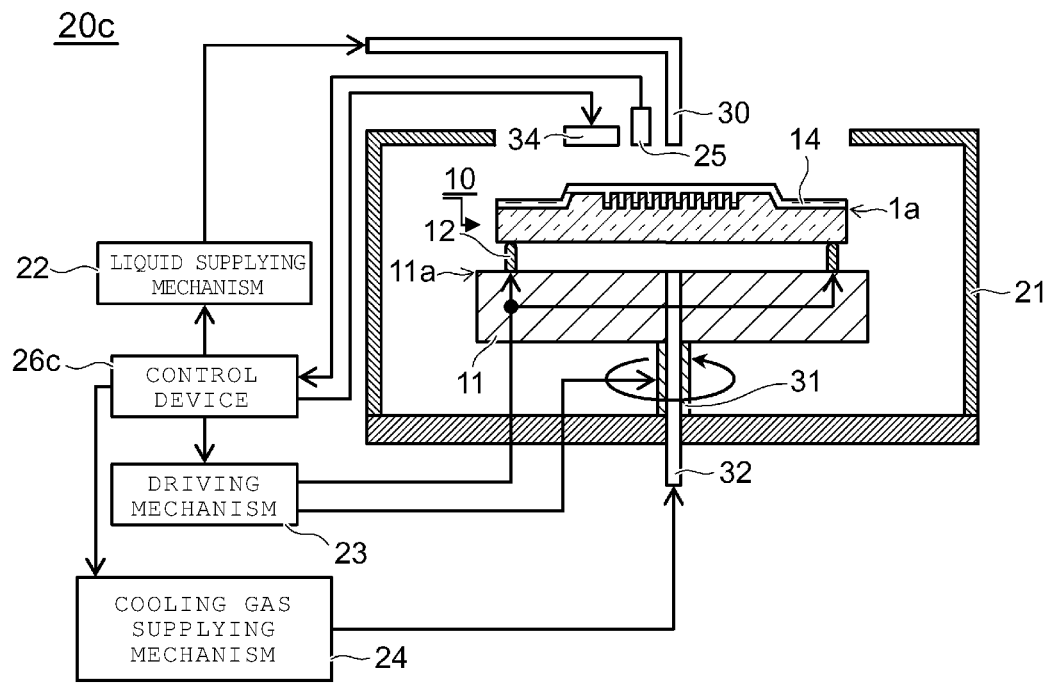
FIG. 10 is a schematic cross-sectional view schematically illustrating the cleaning device of the substrate according to a third example.

FIG. 10 is a schematic cross-sectional view schematically illustrating the cleaning device of the substrate according to a third example. The cross-section illustrated in FIG. 10 corresponds to the cross-section illustrated in FIG. 8.

The cleaning device 20c according to a third example is an example in which the internal pressure of the liquid film 14 can be varied by the following feature.

(3) Applying an Acoustic Wave to the Liquid Film 14

As illustrated in FIG. 10, a difference between the cleaning device 20c according to the third example and the first example illustrated in FIG. 8 is that the third example further includes an ultrasound wave generating device 34.

The ultrasound wave generating device 34 is arranged above the template 10, for example. The ultrasound wave generating device 34 is not limited to above the template 10, and may be arranged at a position where the acoustic wave can be applied to the liquid film 14. The ultrasound wave generating device 34 is connected to a control device 26c.

When the temperature of the liquid film 14 reaches the "set temperature", the control device 26c instructs the ultrasound wave generating device 34 to generate the acoustic wave. The ultrasound wave generating device 34 receiving the command generates the acoustic wave. The generated acoustic wave varies the internal pressure of the liquid film 14. The liquid film 14 in a state of supercooling is solidified by applying the acoustic wave thereto. The acoustic wave may be an ultrasonic wave or a low frequency. The range of the acoustic wave is, for example, a frequency of 20 Hz or more and less than 20 kHz, a frequency of the ultrasonic wave is more than 20 kHz, and a frequency of the low frequency is less than 20 Hz.

The method for cleaning a substrate according to the first embodiment can be executed by the cleaning device 20c according to the third example as illustrated in FIG. 10, for example.

Cleaning Device: Fourth Example

Figure 11:
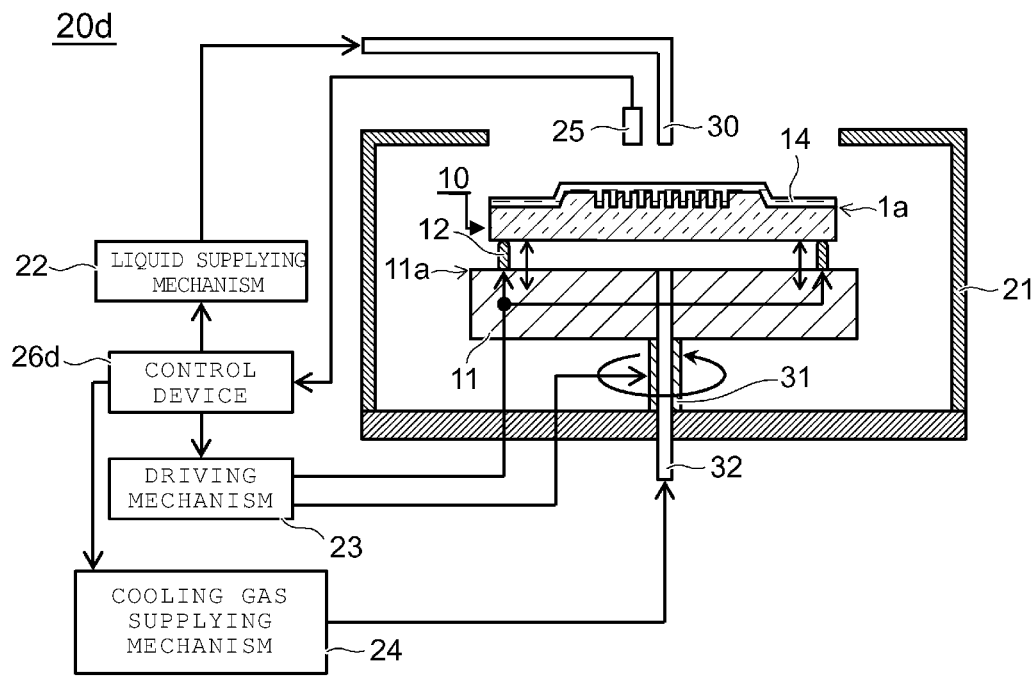
FIG. 11 is a schematic cross-sectional view schematically illustrating the cleaning device of the substrate according to a fourth example.

FIG. 11 is a schematic cross-sectional view schematically illustrating the cleaning device of the substrate according to a fourth example. The cross-section illustrated in FIG. 11 corresponds to the cross-section illustrated in FIG. 8.

The cleaning device 20d according to a fourth example is an example in which the internal pressure of the liquid film 14 can be varied by the following feature.

(4) Vibrating the Template 10

As illustrated in FIG. 11, the cleaning device 20d according to the fourth example has substantially the same structure as the first example illustrated in FIG. 8. The difference is the control method of a control device 26d.

When the temperature of the liquid film 14 reaches the "set temperature", the control device 26d instructs the lift pin driving portion of the driving mechanism 23 to move the lift pins 12, vertically. The driving mechanism 23 receiving the command moves the lift pins 12 vertically. By moving the lift pins 12 vertically, the template 10 is vibrated. By vibrating the template 10, the internal pressure of the liquid film 14 in a state of supercooling is changed. The liquid film 14 in a state of supercooling is solidified.

The method for cleaning a substrate according to the first embodiment can be executed by the cleaning device 20d according to the fourth example as illustrated in FIG. 11, for example.

Cleaning Device: Fifth Example

Figure 12:
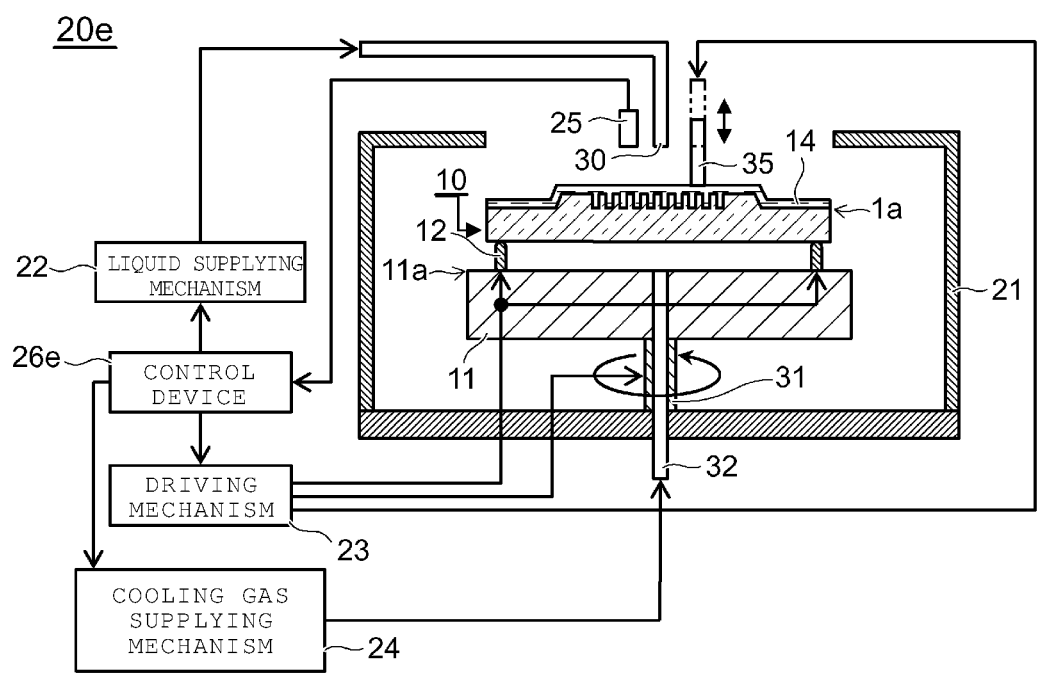
FIG. 12 is a schematic cross-sectional view schematically illustrating the cleaning device of the substrate according to a fifth example.

FIG. 12 is a schematic cross-sectional view schematically illustrating the cleaning device of the substrate according to a fifth example. The cross-section illustrated in FIG. 12 corresponds to the cross-section illustrated in FIG. 8.

The cleaning device 20e according to a fifth example is an example in which the internal pressure of the liquid film 14 can be varied by the following feature.

(5) Vibrating the Liquid Film 14

As illustrated in FIG. 12, a difference between the cleaning device 20e according to the fifth example and the first example illustrated in FIG. 8 is that the fifth example further includes a vibrating pole 35.

The pole 35 is, for example, arranged above the template 10. The pole 35 is not limited to a position above the template 10, and may be arranged at a position where the pole 35 can be brought into contact with the liquid film 14. The pole 35 is connected to the driving mechanism 23.

The driving mechanism 23 of the fifth example further includes a pole driving portion. The pole driving portion drives the pole 35, for example, to move vertically.

When the temperature of the liquid film 14 reaches the "set temperature", a control device 26e instructs the pole driving portion of the driving mechanism 23 to move the pole 35 vertically (upward and downward). The driving mechanism 23 receiving the command moves the pole 35 downward. By moving down the pole 35 downward, the pole 35 comes in contact with the liquid film 14. By contacting with the pole 35, the internal pressure of the liquid film 14 in a state of supercooling is changed. The liquid film 14 in a state of supercooling is then solidified. Thereafter, the pole 35 is raised.

The method for cleaning a substrate according to the first embodiment can be executed by the cleaning device 20e according to the fifth example as illustrated in FIG. 12, for example.

Cleaning Device: Sixth Example

Figure 13:
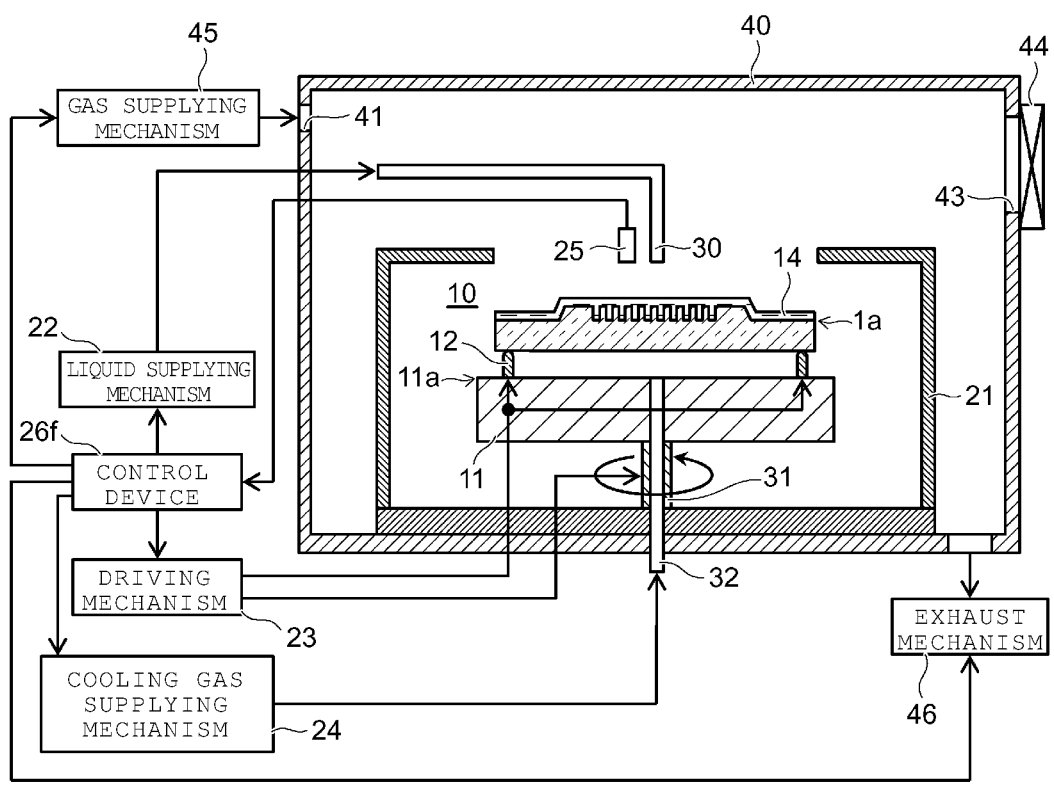
FIG. 13 is a schematic cross-sectional view schematically illustrating the cleaning device of the substrate according to a sixth example.

FIG. 13 is a schematic cross-sectional view schematically illustrating the cleaning device of the substrate according to a sixth example. The cross-section illustrated in FIG. 13 corresponds to the cross-section illustrated in FIG. 8.

The cleaning device 20f according to a sixth example is an example in which the internal pressure of the liquid film 14 can be varied by the following feature.

(6) Changing the Pressure Inside the Chamber that Stores the Template 10

As illustrated in FIG. 13, the cleaning device 20f according to the sixth example has substantially the same structure as the first example illustrated in FIG. 8. The chamber 40 omitted in FIGS. 8 to 12 is illustrated in FIG. 13. The cleaning device 20f according to the sixth example is accommodated in the chamber 40.

A gas supplying port 41, an exhaust port 42, and a loading and unloading port 43 are provided in the chamber 40. The template 10 is loaded inside the chamber 40 and is unloaded from the chamber 40 through the loading and unloading port 43. The loading and unloading port 43 is opened and closed by a gate valve 44.

The gas supplying port 41 is connected to a gas supplying mechanism 45. The exhaust port 42 is connected to an exhaust mechanism 46. The gas supplying mechanism 45 supplies the gas into the chamber 40 through the gas supplying port 41. An example of the gas is air. Inert gas such as nitrogen gas may be supplied in addition to the air. The exhaust mechanism 46 exhausts the inside of the chamber 40 through the exhaust port 42.

When the temperature of the liquid film 14 reaches the "set temperature", a control device 26f controls the gas supplying mechanism 45 and the exhaust mechanism 46. The gas supplying mechanism 45 changes a flow rate of the gas to be supplied based on the command from the control device 26f. The exhaust mechanism 46 varies exhaust force based on the command from the control device 26f. Therefore, the pressure in the chamber 40 is changed. The pressure in the chamber 40 may be any one of pressure rising and pressure decreasing.

By changing the pressure inside the chamber 40, the internal pressure of the liquid film 14 in a state of supercooling is changed. The liquid film 14 in a state of supercooling is then solidified.

The method for cleaning a substrate according to the first embodiment can be executed by the cleaning device 20f according to the sixth example as illustrated in FIG. 13, for example.

According to the second embodiment, it is possible to provide the cleaning device of the substrate which is capable of obtaining a substrate with a high degree of cleanliness of a patterned surface.

For example, the embodiment exemplifies cleaning of the template 10 to be used for imprint lithography, for example, nanoimprint lithography. However, the embodiment can also be applied to cleaning of the substrate in the production of a flat panel display, the production of a solar panel, and the production of a semiconductor device, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A method for cleaning a substrate, comprising:
   dispensing a liquid onto the substrate mounted on a rotatable stage;
   cooling the liquid on the substrate to a supercooled state;
   varying a rotational speed of the rotatable stage with the substrate mounted thereon and the liquid on the substrate in the supercooled state to vary an internal pressure of the liquid when a temperature of the liquid reaches a setpoint temperature to form a solidified body on the substrate; and
   melting the solidified body on the substrate.

2. The method according to claim 1, wherein the substrate is a nanoimprint template.

3. The method according to claim 1, wherein the rotatable stage is disposed in a cleaning cup.

4. The method according to claim 1, further comprising:
   measuring the temperature of the liquid on the substrate during the cooling of the liquid on the substrate.

5. The method according to claim 1, wherein varying the rotational speed includes increasing the rotational speed.

6. The method according to claim 1, wherein varying the rotational speed includes changing an acceleration of the rotatable stage.

7. The method according to claim 1, further comprising:
   rinsing the liquid from the substrate after melting of the solidified body; and
   drying the substrate after the rinsing of the liquid from the substrate.

8. The method according to claim 1, further comprising:
   cooling the solidified body on the substrate to a temperature below a freezing point of the liquid.

9. The method according to claim 1, wherein the liquid is deionized water.

10. The method according to claim 1, wherein cooling the liquid is performed by supplying cooling gas from a backside direction of the substrate through a pipe provided in a shaft of the rotatable stage.

11. A method for cleaning a substrate, comprising:
    dispensing a liquid onto a nanoimprint template mounted on a rotatable stage;

cooling the liquid on the nanoimprint template to a supercooled state;

increasing a rotational speed of the rotatable stage with the nanoimprint template mounted thereon and the liquid in the supercooled state to vary an internal pressure of the liquid when a temperature of the liquid reaches a setpoint temperature to form a solidified body on the nanoimprint template; and melting the solidified body.

12. The method according to claim 11, further comprising:

rinsing the liquid from the nanoimprint template after melting of the solidified body; and drying the nanoimprint template after the rinsing of the liquid.

13. The method according to claim 11, wherein cooling the liquid is performed by supplying cooling gas from a backside direction of the nanoimprint template through a pipe provided in a shaft of the rotatable stage.

* * * * *